United States Patent [19]

Bertotti et al.

[11] Patent Number: 5,185,649

[45] Date of Patent: Feb. 9, 1993

[54] CIRCUITAL ARRANGEMENT FOR PREVENTING LATCHUP IN TRANSISTORS WITH INSULATED COLLECTORS

[75] Inventors: Franco Bertotti, Milan; Paolo Ferrari, Gallarate, both of Italy

[73] Assignee: SGS-Thomson Microelectronics, S.r.l., Italy

[21] Appl. No.: 675,558

[22] Filed: Mar. 26, 1991

[30] Foreign Application Priority Data

Mar. 29, 1990 [IT] Italy .............................. 19862 A/90

[51] Int. Cl.[5] ............................................ H01L 27/02
[52] U.S. Cl. ..................................................... 357/43
[58] Field of Search ............................................ 357/43

[56] References Cited

U.S. PATENT DOCUMENTS 3,829,709  8/1974  Maigret et al. ..................... 357/35
4,887,142 12/1989  Bertotti et al. ..................... 357/43

Primary Examiner—John D. Lee
Assistant Examiner—Robert E. Wise
Attorney, Agent, or Firm—Townsend and Townsend

[57] ABSTRACT

A circuital arrangement which comprises a vertical PNP transistor with insulated collector, which has a P-type collector structure surrounded by an N-type well and forms a junction therewith. In order to prevent latch-ups of the parasite SCR which is formed by the structure of the vertical transistor with insulated collector without limiting the voltage which can be applied between the collector and the emitter thereof to values below the intrinsic breakdown ones, the circuital arrangement comprises an auxiliary PNP transistor the emitter whereof is short-circuited with the emitter of the vertical PNP transistor, the base whereof is connected to the base of the vertical PNP transistor and the collector whereof is connected to the N-type well, and operates as a switch which biases the N-type well at a voltage which is close to the voltage of the emitter of the vertical PNP transistor when the latter is saturated, reverse-biasing the collector/N-well junction, and opens when the vertical PNP transistor is off, limiting the voltage applied to the collector/N-well junction.

20 Claims, 1 Drawing Sheet

CIRCUITAL ARRANGEMENT FOR PREVENTING LATCHUP IN TRANSISTORS WITH INSULATED COLLECTORS

BACKGROUND OF THE INVENTION

The present invention relates to a circuital arrangement for preventing latch-up phenomena in vertical PNP transistors with insulated collector.

As is known, in vertical PNP transistors with insulated collector, an N-type epitaxial well is present around the collector structure and must be connected to an appropriate voltage in order to avoid problems in the operation of said PNP transistor.

On this subject, reference should be made to FIG. 1, which is a transverse sectional view of a portion of a wafer of semiconductor material which integrates an insulated-collector PNP transistor. In this figure, the P-type substrate is indicated by 1, whereas 2 indicates the epitaxial layer, in which P-type insulation regions 3, which extend from the substrate to the main surface 4 of the device which integrates, among other devices, the PNP transistor, separate the well 2' from the other portions of the epitaxial layer. An N-type buried layer (a so-called "bottom N-well") 5 extends astride the substrate 1 and the epitaxial layer 2 (within the region delimited by the insulations 3), and the P-type collector layer 6 extends above the buried layer 5 and is connected to the main surface 4 of the device by means of a deep region 7, again of the P type, which extends in a ring-like shape and delimits a further well 2'' of the epitaxial layer, which defines the base of the transistor.

A region 8 (which defines the so-called "top N-well") is indicated inside said second well 2'', and an enhanced N-type region 10, at the base contact B, and the P-type emitter region 11 are formed therein.

The figure furthermore illustrates the emitter, base and collector contacts, respectively E, B and C, of the vertical PNP transistor, and a contact S for connecting the well 2' to an appropriate voltage; said contact is provided at an enhanced region which faces the main surface 4. FIG. 1 furthermore illustrates the electrical equivalents of some components which are the result of the illustrated structure, which comprises: the required vertical PNP transistor, which is indicated by 15 and is formed by the emitter layer 11, by the base layers 2'', 8, 10 and by the collector layers 6, 7; a parasite NPN transistor 16 formed by the collector emitter 2'', by the base layer 6 and by the emitter base 5; a parasite SCR 17, which is formed by the transistors 15 and 16; and a further parasite PNP transistor 18 formed by the emitter layer 6, the base layers 5 and 2' and the collector layer 1.

In order to prevent the parasite PNP transistor 18 from having an open base and to prevent the occurrence of unwanted latch-up phenomena affecting the SCR 17, due for example to voltage gradients (dV/dt) which can occur across it, it is therefore necessary to connect the N-well 2' to an appropriate voltage.

For this purpose, it has already been thought to connect the N-well 2', which also is the emitter of the parasite NPN transistor 16, to the emitter of the vertical PNP transistor, which is usually connected to the highest voltage ($V_{cc}$), short-circuiting the contacts E and S. The equivalent electrical layout is shown in FIG. 2, in which only the vertical PNP transistor 15 and the parasite NPN transistor 16 have been illustrated for the sake of clarity.

However, although this solution is very simple and suitable for avoiding the latch-up of the SCR 17, it is not free from disadvantages, since the breakdown voltage which can be withstood between the emitter and the collector of the vertical transistor 15 is limited by the breakdown voltage of the junction formed by the layers 5 and 6 (i.e., by the breakdown of the base-emitter junction of the parasite NPN transistor 16, which, as is clearly illustrated in FIG. 2, by means of the indicated connection, is parallel-connected to the emitter-collector portion of the vertical PNP transistor 15).

This limitation does not create problems for low-voltage processes (up to 10 V), but is unacceptable in case of high-voltage processes.

Another solution consists in connecting the N-well 2' to the collector of the vertical PNP transistor 15 (connecting the contact S to the contact C), thus short-circuiting the base-emitter junction of the parasite NPN transistor 16. However, this solution entails only a local short-circuit, and in the presence of high currents, due to the drop on the collector layer 6, said base-emitter junction can become forward-biased, causing on the average the latch-up of the parasite SCR 17.

SUMMARY OF THE INVENTION

Given this situation, the aim of the present invention is to provide a circuital arrangement for preventing latch-up phenomena in vertical PNP transistors with insulated collector which can solve the disadvantages of the prior art, and in particular can prevent, effectively and in any operating condition, even in the presence of high currents and/or rapid voltage variations, the latch-up of parasite devices which are intrinsic to the structure of vertical insulated-collector transistors.

Within the scope of this aim, a particular object of the present invention is to provide a circuital arrangement which can also be used in high-voltage processes and in particular is such as not to entail limitations in the operation of the vertical transistor due to early breakdown with respect to the breakdown values of the vertical transistor itself.

An important object of the present invention is to provide a circuital arrangement of the indicated type which is simple both conceptually and from the point of view of execution and is thus highly reliable.

Still another object of the present invention is to provide a circuital arrangement of the indicated type which does not require a large number of components and in particular does not have a large area occupation.

Not least object of the present invention is to provide a circuital arrangement which can be easily integrated and which does not require, for its manufacture, devices or processes which differ from those commonly used in the electronics industry and thus has modest manufacturing costs.

This aim, these object and other which will become apparent hereinafter are achieved by a circuital arrangement for preventing latch-up phenomena in vertical PNP transistors with insulated collector, as defined in the accompanying claims.

BRIEF DESCRIPTION OF THE DRAWINGS

The characteristics and advantages of the invention will become apparent from the description of a preferred embodiment, illustrated only by way of nonlimitative example in the accompanying drawings, wherein:

FIGS. 1 and 2 are not described hereinafter; reference is made to the preceding description for said figures.

DESCRIPTION OF THE PREFERRED EMBODIMENTS

Figure 1:
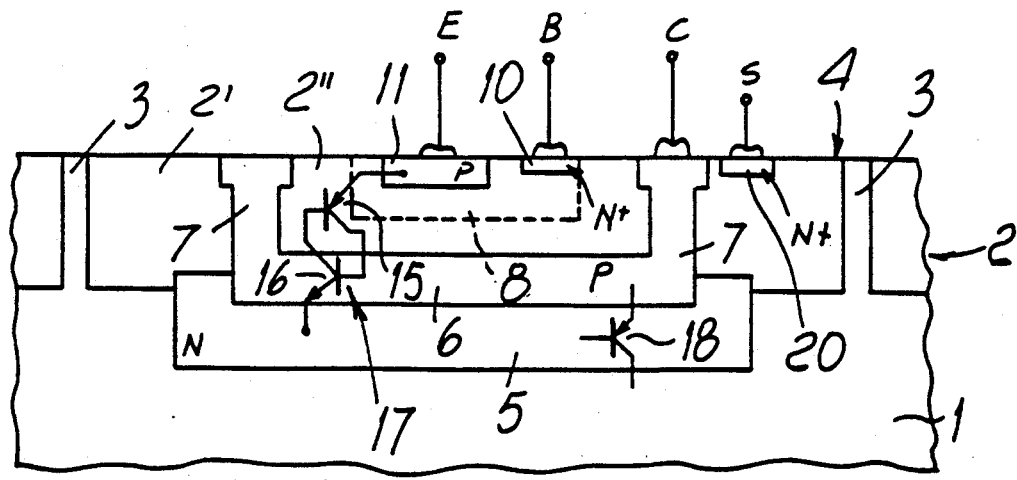
FIG. 1 is a transverse sectional view taken through a silicon wafer which integrates a vertical PNP transistor with insulated collector.
Figure 3:
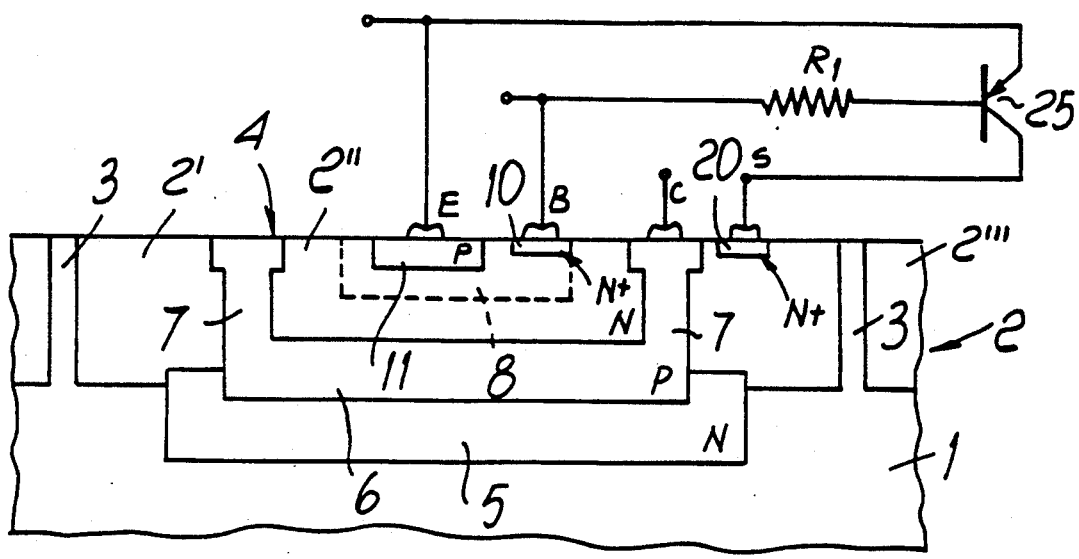
FIG. 3 is a combined view, partially representing a transverse cross-section and partially illustrating an electric equivalent, of the arrangement according to the invention.
Figure 2:
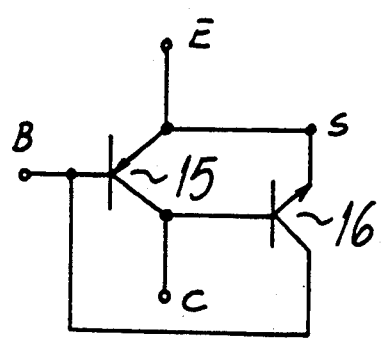
FIG. 2 is a simplified equivalent circuit layout of the arrangement, in which the N-well which is external to the collector of the vertical PNP transistor is short-circuited with the emitter of said transistor.

With reference to FIG. 3 the arrangement according to the invention comprises, besides the vertical PNP transistor with insulated collector, which is provided in a known manner (and for which the same reference numerals used for FIG. 1 have therefore been kept), an auxiliary PNP transistor 25 which has the function of biasing the N-well 2' (which is external with respect to the collector of the vertical PNP transistor 15) at a voltage which is very close to the voltage of the emitter of the vertical PNP transistor 15 (and is therefore higher than the collector voltages of said transistor), avoiding the problems of direct connection to said emitter. Essentially, the auxiliary PNP transistor 25 defines a switch which, during the saturated operation of the transistor 15, electrically connects the emitter thereof to the N-well and, when the vertical PNP transistor 15 is off and has a high emitter-collector drop, opens in turn, preventing the entire emitter-collector drop from being applied to the base-emitter junction of the parasite NPN transistor 16 (junction between the collector of the vertical PNP transistor and the buried N-type layer 5).

In detail, the structure of FIG. 3 furthermore comprises a P-type substrate 1 and an N-type epitaxial layer 2, which accommodate, inside them, the insulation layer 3, the N-type layer 5 which defines the bottom N-well, the collector layers 6 and 7, the base layer 2'' and the emitter layer 11 of the vertical PNP transistor 15. The N+-type enhanced regions 10 and 20 are again furthermore provided, and the emitter, base and collector contacts E, B and C of the vertical PNP transistor 15 and the contact S of the N-type well 2' are furthermore represented on the surface 4. According to the invention, an auxiliary PNP transistor 25 is defined in a well which is insulated from the well 2' which accommodates the vertical PNP transistor 15 (e.g. a well 2''' adjacent to the well 2'), and the emitter of said auxiliary transistor is connected to the emitter E of the vertical PNP transistor 15, its base is connected to the base of said transistor by means of a resistor $R_1$, and its collector is connected to the N-well 2' which surrounds the collector of the transistor 15. The auxiliary transistor 25 and the resistor $R_1$ can be executed according to any appropriate method (e.g., the auxiliary transistor can be provided as a lateral or vertical PNP, whereas the resistor $R_1$ can be provided as a diffused or implanted resistor). The resistor $R_1$, the value whereof depends on the current levels which circulate in the circuit and in any case is not critical, has the function of limiting the current which flows in the auxiliary transistor 25 to very low levels, so that said auxiliary transistor can have a minimal area, so as not to increase in practice the area occupation of the circuit which comprises the vertical PNP transistor 15.

Figure 4:
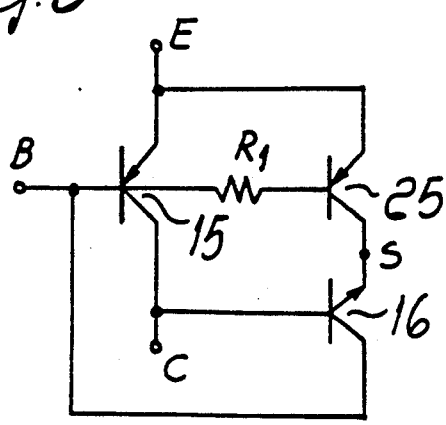
FIG. 4 is a simplified circuit layout of the arrangement according to the invention.

By virtue of the described connection, and in particular of the common driving between the vertical PNP transistor 15 and the auxiliary PNP transistor 25, said two transistors are driven together so as to saturate or switch off, and therefore, when the vertical PNP transistor 15 saturates, the auxiliary transistor is also saturated, raising the N-well 2' to a voltage which is close to that of the emitter E of the vertical transistor 15 and thus reverse-biasing the base-emitter junction of the parasite transistor 16 (see also on this subject FIG. 4, which illustrates the electrical connections between these three components), which thus cannot switch on.

By way of example, consider the case of a vertical PNP power transistor 15 which has a saturation resistance of 0.3 Ω at a collector current of 3 A. In this condition, the transistor 15 has a drop of 0.9 V between the emitter and the collector. The auxiliary PNP transistor 25 has, between the emitter and the collector, a drop of 10–20 mV (emitter-collector saturation voltage for a nil collector current), and therefore the N-well which surrounds the collector of the vertical PNP transistor 15 (illustrated by the contact S in FIG. 4) is at a voltage which is very close to the emitter voltage of the vertical PNP transistor. Therefore, the junction between the N-well 2' and the collector 6, 7 of the vertical PNP transistor (base-emitter junction of the NPN transistor 16) is reverse-biased by approximately 0.9 V.

Instead, when the vertical PNP transistor 15 is off, part of its emitter-collector drop is withstood by the auxiliary transistor 25, which is also off, so that the base-emitter junction of the parasite NPN transistor 16 is not raised to its breakdown voltage and thus does not limit the collector-emitter drop which can be applied to the vertical PNP transistor and allows to use it even in high-voltage circuits.

As can be seen from the above description, the invention fully achieves the intended aim and objects. A circuital arrangement has in fact been provided which can also be applied to high-voltage devices without having unwanted latch-ups of parasite structure.

The invention is furthermore circuitally simple, is reliable, does not require a high area expenditure (since, as mentioned, the auxiliary transistor 25 can be executed with a minimal area) and can be easily integrated, without requiring modifications in known manufacturing processes, so that it has manufacturing costs comparable with those of known solutions.

The invention thus conceived is susceptible to numerous modifications and variations, all of which are within the scope of the inventive concept.

All the details may furthermore be replaced with other technically equivalent ones.

We claim:

1. Circuital arrangement for preventing latch-up phenomena in vertical PNP transistors with insulated collector, comprising a vertical PNP transistor with insulated collector which has its collector, base and emitter regions connected to respective terminals, said collector region, which is of the P type, being surrounded by an N-type well which forms a junction therewith, said vertical PNP transistor being driven so as to have at least one saturated on state and one off state, said circuital arrangement further comprising switch means which are interposed between said emitter region and said N-type well, said switch means being suitable for connecting said N-type well to said emitter region when said vertical PNP transistor is in the saturated on state and for opening when said vertical PNP transistor is in the off state.

2. Circuital arrangement according to claim 1, wherein said switch means comprise an auxiliary transistor which has its own emitter and collector terminals connected between said terminals of said vertical PNP transistor and said N-type well.

3. Circuital arrangement according to claim 2, wherein said auxiliary transistor is a PNP-type transistor the emitter terminal whereof is connected to the emitter terminal of the vertical PNP transistor, the base terminal whereof is connected to the base terminal of the vertical PNP transistor and the collector terminal whereof is connected to said N-type well.

4. Circuital arrangement according to claim 3, further comprising a resistor which is interposed between said base terminals of said vertical PNP transistor and of said auxiliary PNP transistor.

5. Circuital arrangement according to claim 3, wherein said auxiliary PNP transistor is integrated in an epitaxial well which is insulated with respect to said vertical PNP transistor.

6. A circuit arrangement for PNP transistors with junction-isolated collectors in an integrated circuit semiconductor substrate, comprising
    a first PNP transistor having collector, base and emitter regions surrounded by a first N-type well in said substrate; and
    a second PNP transistor having collector, base and emitter regions surrounded by a second N-type well separate from said first N-type well in said substrate, said emitter region of said second PNP transistor connected to said emitter region of said first PNP transistor, said base region of said second PNP transistor connected to said base region of said first PNP transistor, and said collector region of said first PNP transistor connected to said first N-type well;
    whereby said first PNP transistor is prevented from latching up.

7. The circuit of arrangement of claim 6 further comprising a resistive means connected between said base regions of said first and second PNP transistors.

8. The circuit arrangement of claim 7 wherein said resistive means comprises a diffused region in said semiconductor substrate.

9. The circuit arrangement of claim 7 wherein said resistive means comprises a implanted region in said semiconductor substrate.

10. The circuit arrangement of claim 7 wherein said resistive means has a resistance value selected so that currents in said second PNP transistor are sufficiently low whereby said PNP transistor occupies a minimal area.

11. The circuit arrangement of claim 6 wherein said second PNP transistor is a vertical transistor.

12. The circuit arrangement of claim 6 wherein said second PNP transistor is a horizontal transistor.

13. The circuit arrangement of claim 6 wherein said first and second N-type wells are formed in an epitaxial layer on said semiconductor substrate.

14. A circuit arrangement of a PNP transistor in an integrated circuit semiconductor substrate, comprising
    a first transistor in a well of a first conductivity type in said substrate, said first transistor having a collector region of a second conductivity type in said first well, a base region of said first conductivity type in said collector region, and an emitter region of said first conductivity type in said base region;
    a second transistor in a second well of said first conductivity type in said substrate, said second well separated from said first well, said second transistor having a collector region of said second conductivity type in said second well, said collector region connected to said first well, a base region of said first conductivity type connected to said base region of said first transistor, and a emitter region of said second conductivity type connected to said emitter region of said first transistor;
    whereby said first transistor is prevented from latching up.

15. The circuit arrangement as in claim 14 further comprising resistive means connected between said base regions of said first and second transistors.

16. The circuit arrangement as in claim 15 wherein said first transistor is a power transistor and said second transistor is an auxiliary transistor occupying minimal area in said substrate.

17. The circuit arrangement as in claim 16 wherein said first conductivity type is N-type and said second conductivity type in P-type.

18. The circuit arrangement as in claim 15 wherein said resistive means comprises a resistor having a value such that currents in said second transistor are sufficiently low whereby said second transistor can occupy a minimal area in said substrate.

19. The circuit arrangement as in claim 18 wherein said resistor comprises a diffused resistor.

20. The circuit arrangement as in claim 18 wherein said resistor comprises an implanted resistor.

* * * * *